United States Patent [19]
Abercrombie et al.

[11] Patent Number: 5,937,324
[45] Date of Patent: Aug. 10, 1999

[54] METHOD FOR FORMING A LINE-ON-LINE MULTI-LEVEL METAL INTERCONNECT STRUCTURE FOR USE IN INTEGRATED CIRCUITS

[75] Inventors: David A. Abercrombie; Rickey S. Brownson, both of Cedar Park; Michael R. Cherniawski, Austin, all of Tex.

[73] Assignee: Motorola, Inc., Schaumburg, Ill.

[21] Appl. No.: 09/041,646

[22] Filed: Mar. 13, 1998

Related U.S. Application Data

[62] Division of application No. 08/703,223, Aug. 26, 1996, Pat. No. 5,798,568.

[51] Int. Cl.[6] .................................................. H01L 21/768
[52] U.S. Cl. .......................... 438/648; 438/622; 438/618; 438/626; 438/630; 438/633; 438/637; 438/645; 438/675; 438/685; 438/648; 438/649; 438/620
[58] Field of Search ................................... 438/618, 620, 438/622–630, 637–640, 648–649, 669, 633, 675, 685; 257/758, 757, 760, 775, 773

[56] References Cited

U.S. PATENT DOCUMENTS

| | | | |
|---|---|---|---|
| 4,541,893 | 9/1985 | Knight | 156/643 |
| 4,656,732 | 4/1987 | Teng et al. | 29/591 |
| 4,977,105 | 12/1990 | Okamoto et al. | 437/190 |
| 5,243,221 | 9/1993 | Ryan et al. | 257/767 |
| 5,281,850 | 1/1994 | Kanamori | 257/758 |
| 5,294,837 | 3/1994 | Takase et al. | 257/774 |
| 5,374,592 | 12/1994 | MacNaughton et al. | 437/194 |
| 5,510,294 | 4/1996 | Dixit et al. | 438/640 |

*Primary Examiner*—Trung Dang
*Assistant Examiner*—Thanh Nguyen
*Attorney, Agent, or Firm*—Keith E. Witek; George Chen

[57] ABSTRACT

A method of manufacturing a semiconductor component with a multi-level interconnect system includes providing a substrate (11), fabricating a device (12) in the substrate (11), forming an interconnect layer (15) over the substrate (11), depositing a dielectric layer (20) over the interconnect layer (15), depositing a separate interconnect layer (21) over the dielectric layer (20), etching a via (31) in the separate interconnect layer (21) and in the dielectric layer (20), and depositing a different interconnect layer (40) over the separate interconnect layer (21) and in the via (31) wherein the another interconnect layer (40) electrically couples the interconnect layer (15) and the separate interconnect layer (21).

20 Claims, 4 Drawing Sheets

5,937,324

METHOD FOR FORMING A LINE-ON-LINE MULTI-LEVEL METAL INTERCONNECT STRUCTURE FOR USE IN INTEGRATED CIRCUITS

This application is a division of application Ser. No. 08/703,223, filed Aug. 26, 1996, now U.S. Pat. No. 5,798,568.

FIELD OF THE INVENTION

This invention relates, in general, to semiconductors, and more particularly, to semiconductor components with multi-level interconnect systems.

BACKGROUND OF THE INVENTION

Multi-level metal (MLM) systems are comprised of alternating levels or layers of metal and dielectric. Each level of metal in a conventional MLM system typically includes an aluminum-copper or aluminum-copper-silicon layer overlying a barrier metal layer such as titanium nitride or titanium tungsten. Portions of a level of metal that are adjacent to, overlie, or underlie a via are typically at least twice as wide as other portions of the level of metal that are not near the via. The extra width in the level of metal ensures that portions of the underlying substrate or that lower portions of the MLM system are not inadvertently electrically shorted due to the misalignment of a via in the dielectric layer and over-etching. However, the extra width in the level of metal increases the minimum line width and pitch of the tease of metal and can increase memory cell and device sizes. Consequently, the MLM system requires more surface area and increases the footprint of the semiconductor die.

Accordingly, a need exists for a semiconductor component that has a multi-level interconnect system that does not require larger line widths near vias, that is compatible with existing semiconductor manufacturing processes, that is cost effective, and that does not significantly increase the cycle time for manufacturing a semiconductor component.

BRIEF DESCRIPTION OF THE DRAWINGS

FIGS. 1, 2, 3, 4, and 5 illustrate partial cross-sectional views of an embodiment of a semiconductor component during different stages of manufacture in accordance with the present invention;

DETAILED DESCRIPTION OF THE DRAWINGS

Figure 1:
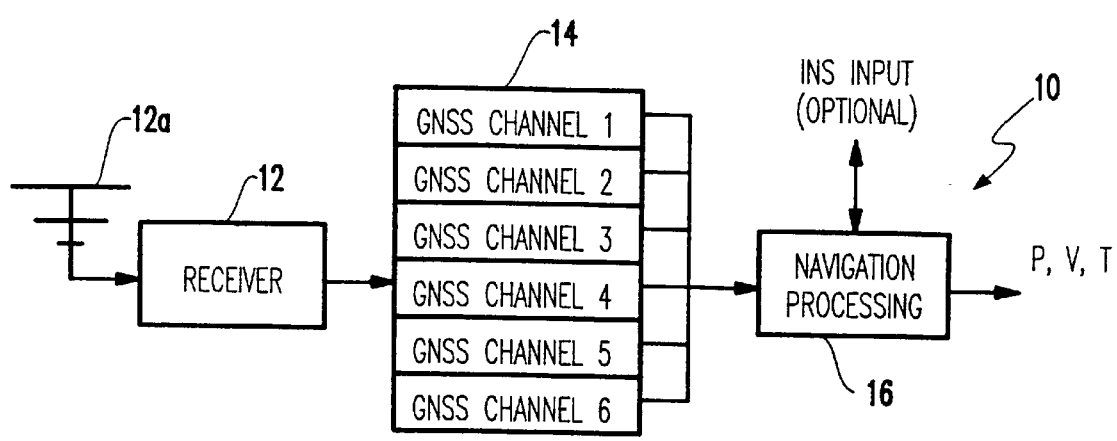
Figure 4:
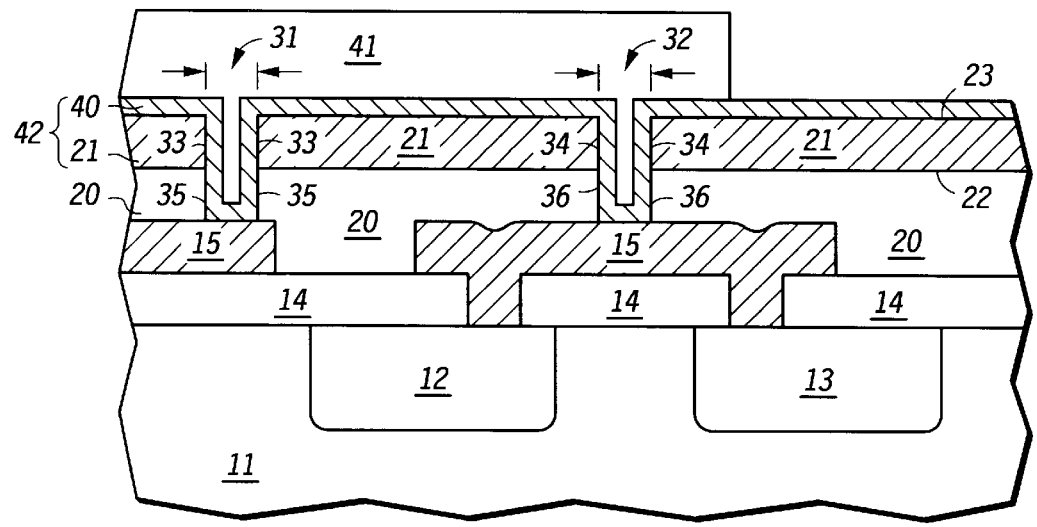
Figure 5:
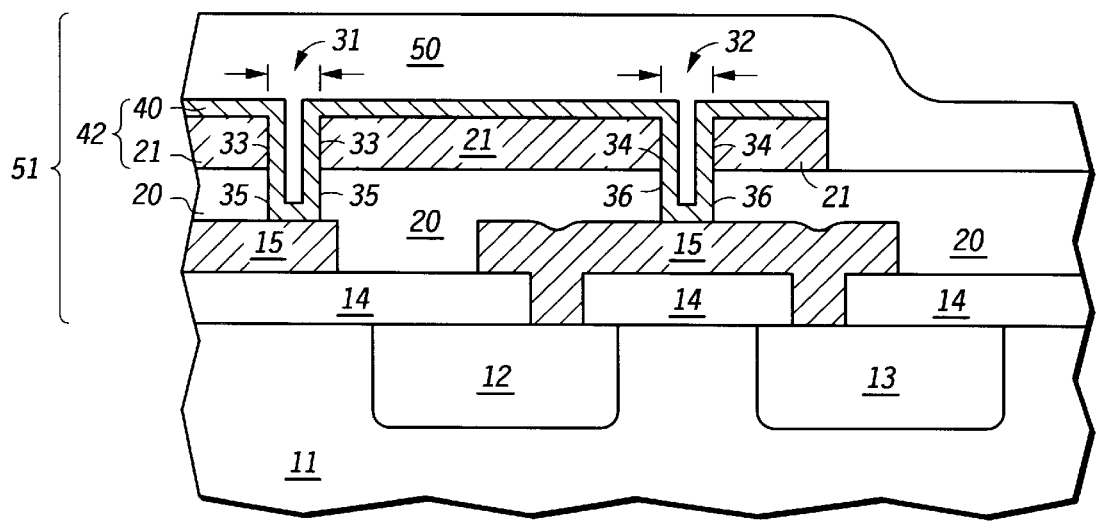

Generally, the present invention allows for the formation of smaller geometry interconnect lines over inter-level vias while maintaining adequate via connection and conductivity. The invention begins by forming a first conductive layer and patterning the layer to form interconnects (FIG. 1). A dielectric layer is then formed on the first conductive layer (FIG. 2). A second conductive layer is formed over the dielectric layer (FIG. 2). However, this second conductive layer is formed on the dielectric layer before vias are formed through the dielectric layer to expose the first conductive layer. The scribe lines between integrated circuits or other key/alignment mark locations on the wafer are cleared by gross lithographic alignment and etch processing which are performed on the second conductive layer. This etch is needed to expose alignment marks to allow for the accurate alignment of the subsequently etched vias if inter-metal dielectric chemical mechanical polishing (CMP) is performed. In another form, if no CMP is utilized, alignment marks in the first conductive layer will show up as indentations in the second conductive layer and these indentations can be used for alignment without the need to clear the scribe lines. The second conductive layer, which is still substantially unpatterned over the integrated circuit (IC) active area, is then etched along with the dielectric layer to form vias not only through the dielectric layer but through the second conductive layer (FIG. 3). A third conductive layer is deposited which connects the second conductive layer to the first conductive layer through the vias (FIG. 4). The composite of both the second conductive layer and the third conductive layer is now patterned using photolithographic and etch techniques to form interconnects lines 42 (FIG. 5).

Because the vias are opened through both the second conductive layer and the dielectric layer (FIG. 3) before interconnect patterning occurs on the second conductive layer (FIG. 5), the interconnect width around the via region can be reduced to the point of being line-on-line. This allows for smaller logic devices, memory cells, and smaller interconnect buses to be formed on an integrated circuit (IC).

The present invention can be further understood with reference to FIGS. 1–10.

FIGS. 1, 2, 3, 4, and 5 illustrate partial cross-sectional views of an embodiment of a semiconductor component 10 during different stages of manufacture. It is understood that the same reference numerals are used in the figures to denote the same elements. Component 10 includes a substrate 11 that can be comprised of a semiconductor such as, for example, silicon or gallium arsenide. A plurality of semiconductor devices 12 and 13 are fabricated in and are supported by substrate 11 using semiconductor processing techniques known to those skilled in the art. As an example, device 12 can represent a field effect transistor area, and device 13 can represent a bipolar transistor area. Because devices 12 and 13 can have many different structures, the depicted structures are only for the purpose of illustrating devices 12 and 13.

In FIG. 1, a dielectric layer or electrically insulative layer 14 is deposited and patterned over substrate 11 and devices 12 and 13 using processes known in the art. Layer 14 is comprised of electrically insulating materials such as silicon nitride, silicon oxide, tetraethylorthosilicate (TEOS) glass, borophosposilicate glass (BPSG), phosposilicate glass (PSG), spin on glasses (SOG), composite oxides, and/or the like. Layer 14 has vias exposing contact portions of device 12 and 13.

An interconnect layer or electrically conductive layer 15 is formed over layer 14 and substrate 11. Layer 15 also overlies and is electrically coupled to devices 12 and 13 through the vias of layer 14. Layer 15 can be deposited using processes such as, is for example, sputtering, evaporating, deposition, selective growth, or plating techniques. Layer 15 is comprised of electrically conductive materials such as, for example, aluminum, copper, titanium, tungsten, silicides, or doped polysilicon. An etch mask 16 is formed over layer 15 and is used to define a pattern for layer 15 during a subsequent etching process. For example, layer 15 can be etched by a fluorine-based dry etchant. Mask 16 can be comprised of photoresist or any other suitable material that can protect portions of layer 15 from exposure to etchant gas. Mask 16 is removed after the etching process for layer 15.

In FIG. 2, a dielectric layer or electrically insulating layer 20 is deposited over layers 14 and 15 and substrate 11 using a chemical vapor deposition (CVD), spin-on-glass (SOG), or other similar process. Layer 20 is preferably planarized using techniques known in the art to provide a substantially planar surface on which to form an additional interconnect layer (e.g. resist etch-back or chemical mechanical polishing (CMP)). Layer 20 can be similar in composition to layer 14 and can have a thickness of approximately four thousand to ten thousand angstroms.

An interconnect layer or electrically conductive layer 21 is deposited over substrate 11 and layers 20, 15, and 14. Layer 21 has a surface 22 facing towards layer 20 and an opposite surface 23 facing away from layer 20. Layer 21 is preferably deposited over layer 20 before a via is etched in layer 20 such that layer 21 is devoid of physical contact with layer 15 and such that layer 21 electrically isolates layers 15 and 21. The deposition and composition of layer 21 can be similar to that of layer 15. Layer 21 can have a thickness of approximately four thousand to ten thousand angstroms.

In FIG. 3, an etch mask 30 is formed over surface 23 of layer 21 and is used to pattern vias 31 and 32 in layer 21. Vias 31 and 32 in layer 21 expose portions of underlying layer 20. Then, mask 30 can also be used to define or extend vias 31 and 32 through layer 20 to expose portions of underlying layer 15. Alternatively, mask 30 can be removed after etching layer 21, and etched layer 21 can be used as an etch mask for layer 20. Accordingly, the via portion of layer 21 extends the via portions of layer 20, and the vias of layer 21 have similar widths as the corresponding vias of layer 20. For best results, mask 30 should not be substantially laterally etched or eroded during the etching of layers 21 or 20. The composition of mask 30 can be similar to that of mask 16 and is typically photoresist (see mask 16 of FIG. 1). The etching of vias 31 and 32 produces sidewalls 33 and 34, respectively, in layer 21 and also produces sidewalls 35 and 36, respectively, in layer 20. As an example, vias 31 and 32 can each have a width of approximately eight thousand to fifteen thousand angstroms. Vias 31 and 32 can be etched using anisotropic etching techniques known in the art.

In FIG. 4, an interconnect layer or electrically conductive layer 40 is deposited over layer 15 and over surface 23 of layer 21 after the removal of mask 30 from FIG. 3. Layer 40 is also deposited in vias 31 and 32 of layers 20 and 21. Layer 40 electrically couples together layers 15 and 21 through vias 31 and 32. Layer 40 physically contacts and overlies layer 21, and layer 40 physically contacts the portions of layer 15 that are exposed by vias 31 and 32. Layer 40 should conformally and physically contact sidewalls 33, 34, 35, and 36. Layers 21 and 40 form a composite interconnect layer 42 for component 10. Layer 40 is preferably comprised of a refractory anti-reflective material to assist in the subsequent formation of an etch mask over layer 40. As an example, layer 40 can be comprised of barrier materials including, but not limited to, titanium, titanium nitride, or titanium tungsten.

In a preferred embodiment, layer 40 is comprised of approximately four hundred to two thousand angstroms of stoichiometric titanium nitride (TiN) because of its anti-reflective properties and because of its ability to be conformally deposited into vias with aspect ratios of greater than approximately two. Layer 40 can also be comprised of a plurality of layers of refractory materials or a composite refractory metal layer. For example, layer 40 can be comprised of a two hundred to four hundred angstrom layer of titanium underneath a four hundred to one thousand angstrom layer of titanium nitride. Layer 40 can be deposited using sputtering techniques, plasma depositions, or other processes known in the art.

An etch mask 41 is formed over layer 40. Mask 41 can be similar to mask 16 (of FIG. 1) and mask 30 (of FIG. 3) and is typically photoresist. Mask 41 defines an etch pattern for both layers 40 and 21. Layers 40 and 21 can be sequentially dry etched using techniques and chemistries well known to those skilled in the art. Because mask 41 overlies layer 40 and because layer 40 is comprised of an anti-reflective coating (ARC) material, a separate anti-reflective coating (ARC) is not required as in the prior art. Therefore, the cycle time for manufacturing component 10 is not increased as compared to the increased cycle time and cost incurred by the prior art techniques.

In FIG. 5, component 10 is portrayed after the patterning of layers 40 and 21 and after depositing a passivation or dielectric layer 50 over layers 40 and 21. Component 10 now has a multi-level interconnect system 51 comprised of interconnect layers 15 and 42 and dielectric layers 14, 20, and 50.

Figure 6:
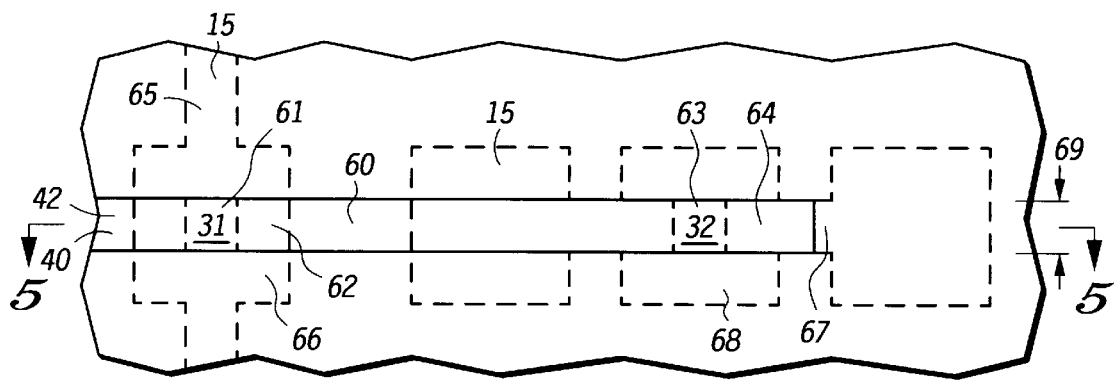
FIG. 6 portrays a partial top view of the semiconductor component of FIG. 5 in accordance with the present invention.

In FIG. 6, a partial top view of component 10 is portrayed. FIG. 5 is a cross-sectional illustration of FIG. 6 when FIG. 6 is cut along line 5—5 of FIG. 6. Elements of FIG. 6 that have the same reference numerals as FIG. 5 are the same as the corresponding FIG. 5 elements except that the elements are illustrated in a top perspective view. In FIG. 6, layer 50 is removed to facilitate a better explanation of the internal structures of component 10. Layers 21 and 40, which form composite layer 42, have a smaller line width or pitch compared to the prior art. Layer 42 does not require a larger line width or pitch at a region adjacent to either of vias 31 or 32, as required in the prior art, because of the method of forming layer 42, as explained in more detail hereinafter.

In contrast, underlying layer 15 (shown as by dashed lines in FIG. 6) has a narrower line width at a portion 65 and has a wider line width at a portion 66 wherein portion 65 is located adjacent to portion 66 and wherein portion 66 is located adjacent to and underlies via 31. As known in the art, portion 66 has a larger line width to compensate for the potential photolithographic misalignment of via 31 and to prevent layer 40, which is located within via 31, from being inadvertently electrically shorted to a layer which may reside beneath layer 15. For similar reasons, a portion 68 of layer 15 has a larger line width than that of a portion 67 of layer 15. In the prior art, interconnect layers that overlie vias also do not have substantially constant line widths. Instead, when a portion of any prior art interconnect layer is adjacent to or filling an underlying via, that portion around the via is formed having a line width that is larger than other portions of the interconnect layer for alignment tolerance reasons similar to that described for portion 66.

However, unlike the prior art, layer 42 has a substantially constant line width. Layer 42 is not misaligned from either of vias 31 or 32 because vias 31 and 32 are formed after the partial deposition of layer 42. In particular, layer 21 is deposited prior to the formation of vias 31 and 32. Accordingly, portions 60, 61, 62, 63, and 64 of layer 42 can have substantially or approximately equal widths wherein portions 61 and 63 are located within vias 31 and 32, respectively, wherein portions 62 and 64 are located adjacent to portions 61 and 63, respectively, and wherein portion 60 is located away from both vias 31 and 32 and is located adjacent to portions 62 and 64. Typically, portion 60 is at least approximately two to five microns away from both vias 31 and 32. As portrayed in FIG. 6, layer 42 has a width 69, which is approximately equal to a width of vias 31 and 32. The smaller line width of layer 42 facilitates a smaller interconnect system 51 and a smaller overall component 10.

Figure 7:
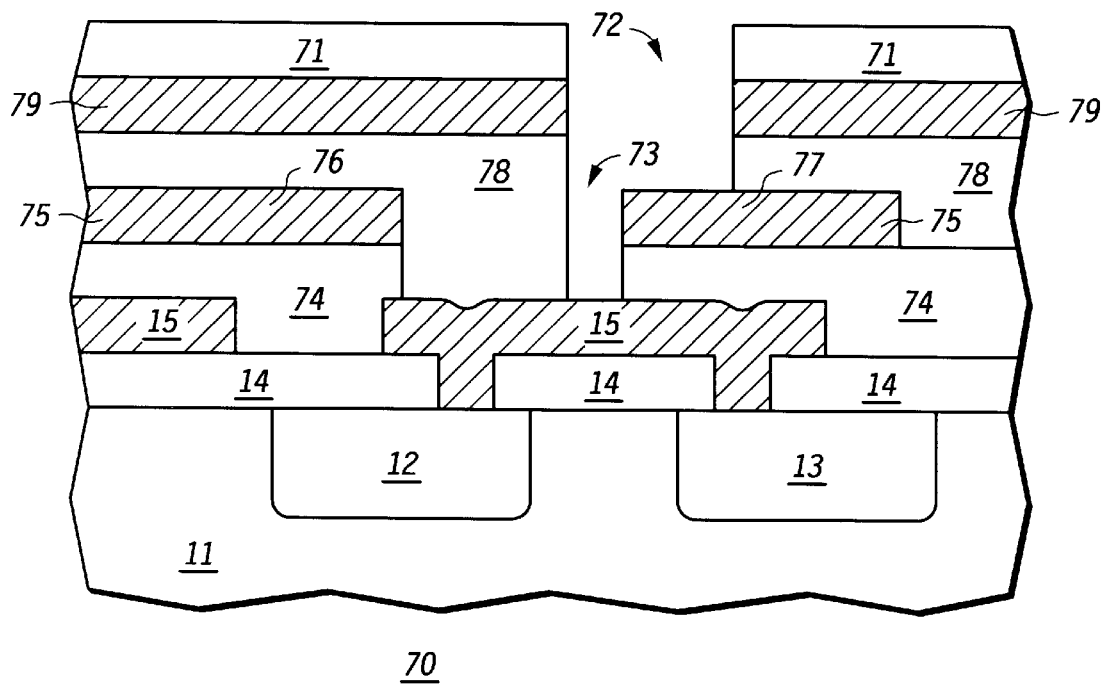
FIGS. 7, 8, and 9 depict partial cross-sectional views of an alternative embodiment of the semiconductor component of FIG. 5 during different stages of manufacture in accordance with the present invention.
Figure 8:
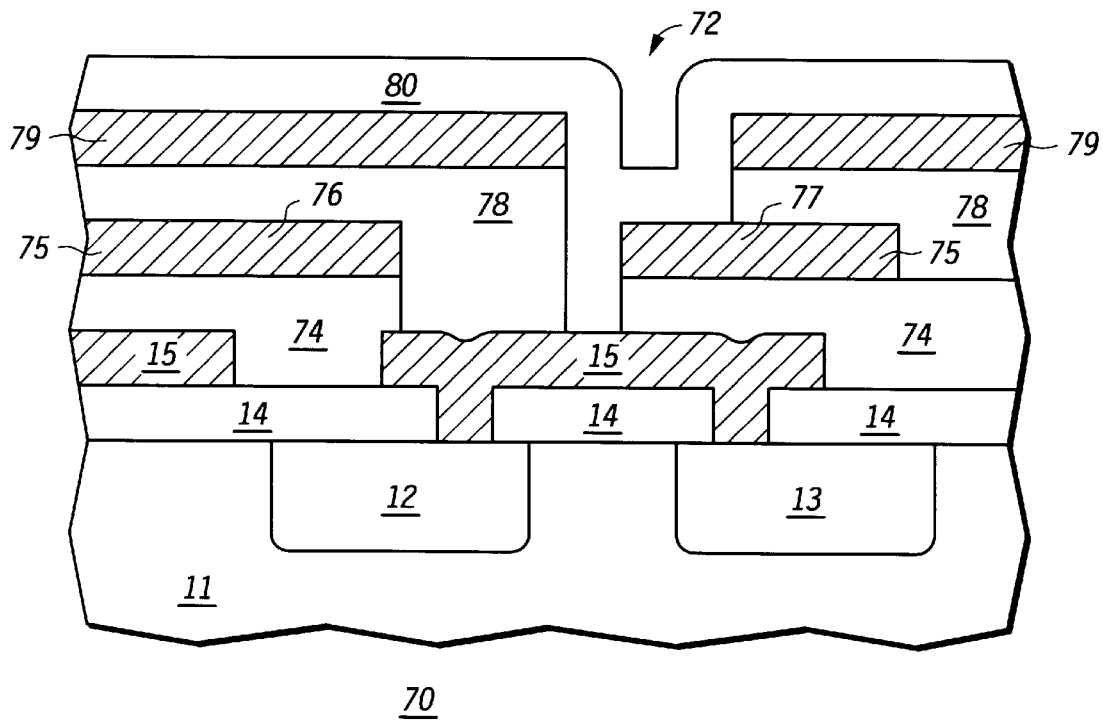
Figure 9:
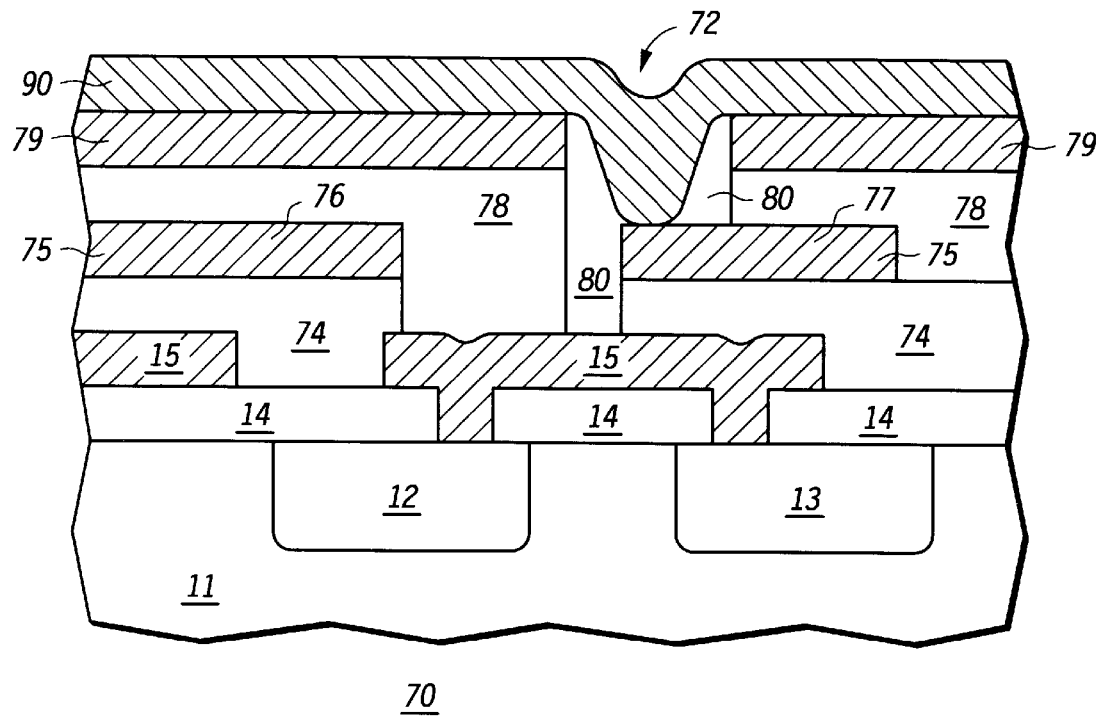

FIGS. 7, 8, and 9 depict partial cross-sectional views of a semiconductor component 70 during different stages of manufacture wherein component 70 is an alternative embodiment of component 10 (FIG. 5). Elements of FIGS. 7, 8, and 9 that have the same reference numerals as FIG. 5 are the same as the corresponding FIG. 5 elements. Component 70 has dielectric or electrically insulating layers 74 and 78 that are similar to layer 20 of FIG. 5. Component 70 also has interconnect or electrically conductive layers 75 and 79 that are similar to layer 21 of FIG. 5. Layer 75 is provided over layer 74, and layers 74 and 75 are etched with the same etch mask (not shown) to form an opening, via, or gap 73 between electrically isolated portions 76 and 77 of layer 75 and to define a width for portions 76 and 77 of layer 75. Then, layer 78 is deposited in gap 73 and over layer 75, and layer 79 is provided over layer 78. An etch mask 71 is formed over layer 79 and is used to sequentially pattern layers 79 and 78 to form an opening or via 72. Via 72 is similar in purpose to vias 31 and 32 of FIG. 5 and facilitates the electrical coupling of layer 79 and portion 77 of layer 75. However, via 72 is accidentally misaligned relative to underlying portion 77, and therefore, via 72 exposes a portion of gap 73 and layer 15. After the removal of mask 71, if an electrically conductive layer were deposited into via 72 and over layer 79, then layer 79 would be electrically shorted to both layer 15 and portion 77 of layer 75. However, portion 77 should be electrically isolated from layer 15.

Therefore, in FIG. 8, a dielectric or electrically insulating layer 80 is deposited over layer 79 and is deposited in via 72 and in the exposed portion of gap 73 after the removal of mask 71 (FIG. 7). The deposition and composition of layer 80 can be similar to that of layer 78. Layer 80 can have a thickness of approximately five hundred to two thousand angstroms. Layer 80 physically contacts the sidewalls of via 72 and the exposed portion of gap 73. Thus, layer 80 is adjacent to layers 15, 74, 75, 78, and 79.

In FIG. 9, layer 80 can be isotropically or anisotropically etched to expose a portion of via 72 and to leave a portion of layer 80 within via 72 and gap 73. Layer 80 remains in via 72 and prevents a subsequently deposited interconnect layer from physically and electrically contacting layer 15 through via 72 and gap 73. Layer 80 has an opening exposing a portion of portion 77 of layer 75. An interconnect or electrically conductive layer 90 is deposited in via 72 and over layer 79. Layer 90 can be similar in composition and thickness to layer 40 of FIG. 5. Layer 90 is adjacent to and physically contacts portion 77 of layer 75 and layers 79 and 80,. Layer 90 electrically couples layers 79 and portion 77 of layer 75. Layer 90 is not electrically coupled to layer 15 because of the presence of layer 80 in gap 73. Layers 90 and 79 are subsequently patterned using a similar technique as described earlier for layers 40 and 21 in FIG. 4.

Figure 10:
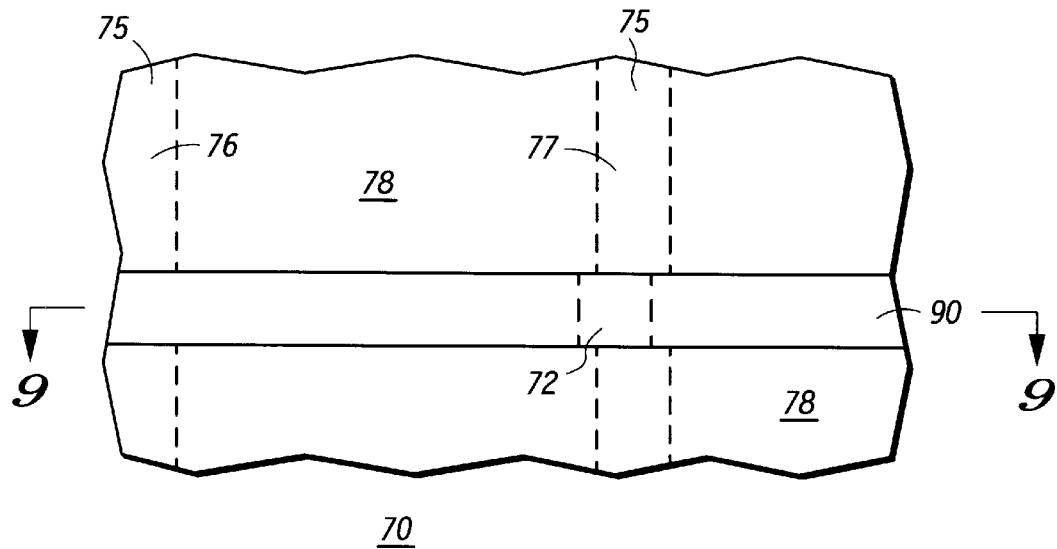
FIG. 10 portrays a partial top view of the semiconductor component of FIG. 9 in accordance with the present invention.

FIG. 10 portrays a partial top view of component 70. FIG. 9 is taken from a section line 9—9 in FIG. 10. Elements of FIG. 10 that have the same reference numerals as FIG. 9 are the same as the corresponding FIG. 9 elements. The use of layer 80 (FIG. 9) enables the reduction of the line width or pitch of layer 75 near via 72. As mentioned hereinbefore, a portion of a prior art interconnect layer that underlies a via has a wider line width than other portions of the prior art interconnect layer that do not underlie a via in order to prevent the inadvertent shorting of conductive layers underlying the prior art interconnect layer. However, in contrast to the prior art, layer 75 has a substantially constant line width wherein the region of portion 77 of layer 75 that is adjacent to and that underlies via 72 has the same width as another region of portion 77 of layer 75 that is not next to via 72. As illustrated in FIG. 10, layers 75 and 90 and via 72 have similar widths. Thus, the area required for multi-level interconnect system of component 70 is reduced compared to the prior art.

Therefore, it is apparent there has been provided an improved semiconductor component that overcomes the disadvantages of the prior art. The present component includes a multi-level interconnect system wherein the interconnect levels have smaller line widths or pitches than the prior art in order to provide a smaller layout for the component. A ten to twenty percent reduction in size has been accomplished by using the multi-level interconnect system described herein. The present component is also cost effective because it is compatible with existing semiconductor processing techniques and because it does not significantly increase the cycle time for manufacturing the component.

While the invention has been particularly shown and described with reference to preferred embodiments, it will be understood by those skilled in the art that changes in form and detail may be made without departing from the spirit and scope of the invention. For instance, the numerous details set forth herein such as, for example, the size of the vias and the chemical compositions and thicknesses of the interconnect and dielectric layers are provided to facilitate the understanding of the present invention and are not provided to limit the scope of the invention. Furthermore, it is understood that vias 31 and 32 in FIG. 5 can be filled in or plugged after the deposition of layer 40 and before the deposition of layer 50. As an example, a conventional tungsten plug process can be used to fill in vias 31 and 32 to improve planarity and improve conductivity in some embodiments. The layer 40 may be CVD aluminum followed by the TiN or like ARC layer with the CVD aluminum having optional doping concentrations of silicon and/or copper. The CVD Al/Tin composite for layer 40 may be used to improve via conductivity. Tungsten or oxide may be used to plug opening left in the via or layer 40 itself may be polished to form plug regions within the vias. By filling in vias 31 and 32 with an electrically conductive material, a stacked via structure can be more easily formed in multi-level interconnect system 51. Accordingly, the disclosure of the present invention is not intended to be limiting. Instead, the disclosure of the present invention is intended to be illustrative of the scope of the invention, which is set forth in the following claims.

What is claimed is:

1. A method of manufacturing a semiconductor component comprising:

providing a semiconductor substrate;

fabricating a semiconductor device in the semiconductor substrate;

forming a first interconnect layer over the semiconductor substrate;

depositing a first dielectric layer over the first interconnect layer;

polishing the first dielectric layer to result in planarization of a top surface of the first dielectric layer;

depositing a second interconnect layer over the first dielectric layer;

forming a first etch mask over the second interconnect layer;

etching a via in the second interconnect layer wherein the via in the second interconnect layer is defined by the first etch mask and wherein the via in the second interconnect layer exposes a portion of the first dielectric layer;

extending the via into the first dielectric layer after etching the via in the second interconnect layer wherein the via in the second interconnect layer exposes the via in the first dielectric layer and the portion of the first interconnect layer;

removing the first etch mask from the second interconnect layer; and depositing a third interconnect layer over the second interconnect layer and in the vias of the first dielectric layer and the second interconnect layer wherein the third interconnect layer electrically couples the first and second interconnect layers.

2. The method of claim 1 further comprising:
depositing as the third interconnect layer, a layer that comprises a refractory metal component.

3. The method of claim 2 wherein the step of etching the via in the second interconnect layer includes providing the via in the second interconnect layer with a sidewall and wherein the step of etching the via in the first dielectric layer includes providing the via in the first dielectric layer with a sidewall and wherein the step of depositing the third interconnect layer includes physically contacting the third interconnect layer with the portion of the first interconnect layer and with the sidewalls of the vias in the first dielectric layer and the second interconnect layer.

4. The method of claim 2 further comprising:
forming a second etch mask over the third interconnect layer; and
patterning the second and third interconnect layers with the second etch mask.

5. The method of claim 4 wherein the step of patterning the second and third interconnect layers includes providing a substantially equal width for a first portion of the second interconnect layer, a second portion of the second interconnect layer, a first portion of the third interconnect layer, and a second portion of the third interconnect layer wherein the first portion of the third interconnect layer is located in and adjacent to the vias of the second interconnect layer and the first dielectric layer and wherein the first portion of the second interconnect layer is located adjacent to the vias of the second interconnect layer and the first dielectric layer and wherein the second portion of the second interconnect layer is located adjacent to the first portion of the second interconnect layer and wherein the second portion of the third interconnect layer is located adjacent to the first portion of the third interconnect layer.

6. The method of claim 2 further comprising:
providing an electrically conductive layer below the first interconnect layer;
depositing a second dielectric layer into the via of the first dielectric layer; and
etching the second dielectric layer to expose a portion of the via of the first dielectric layer and the portion of the first interconnect layer wherein the second dielectric layer prevents the second interconnect layer from physically contacting the electrically conductive layer through the via of the first dielectric layer.

7. The method of claim 2 wherein the step of depositing the third interconnect layer includes providing a refractory anti-reflective material for the third interconnect layer.

8. The method of claim 1 further comprising:
removing the first etch mask from the second interconnect layer;
depositing a second dielectric layer over the second interconnect layer after the step of etching the via in the first dielectric layer;
etching a via in the second dielectric layer to expose a portion of the second interconnect layer;
depositing a third dielectric layer in the via of the second dielectric layer;
etching the third dielectric layer to expose a portion of the via in the second dielectric layer and to expose the portion of the second interconnect layer; and
depositing a third interconnect layer in the portion of the via of the second dielectric layer, the third interconnect layer electrically coupled to the portion of the second interconnect layer, the third dielectric layer electrically isolating the third interconnect layer and the first interconnect layer.

9. The method of claim 8 wherein the step of etching the via in the second interconnect layer includes defining a width of the portion of the second interconnect layer wherein a width of the via in the second dielectric layer is approximately equal to the width of the portion of the second interconnect layer.

10. The method of claim 2 further comprising forming the third interconnect layer as an anti-reflective coating layer.

11. A method for forming a semiconductor structure, the method comprising the steps of:
forming a first conductive layer;
forming an inter-level dielectric layer over the first conductive layer;
forming a second conductive layer overlying the inter-level dielectric layer;
removing first portions of the second conductive layer to expose alignment marks;
using the alignment marks to define a position of a contact opening through the second conductive layer and the inter-level dielectric layer to expose a contact port ion of the first conductive layer;
forming a third conductive layer which electrically contacts both the second conductive layer the contact portion of the first conductive layer, the second and third conductive layers forming a composite interconnect layer; and
masking and etching the composite interconnect layer to form an interconnect structure which is electrically connected to the contact portion of the first conductive layer.

12. A method for manufacturing a semiconductor component, the method comprising the steps of:
providing a semiconductor substrate; forming a plurality of semiconductor devices in the semiconductor substrate;
forming a first interconnect layer over the semiconductor substrate, the first interconnect layer electrically coupled to the plurality of semiconductor devices;
forming a first dielectric layer overlying the first interconnect layer, the first dielectric layer having a via exposing a portion of the first interconnect layer the via having a contact dimension;
forming a second interconnect layer overlying a portion of the first dielectric layer, the second interconnect layer devoid of physical contact with the first interconnect layer, the second interconnect layer having a via exposing the via of the first dielectric layer and exposing the portion of the first interconnect layer; and forming a third interconnect layer overlying the second interconnect layer and the first interconnect layer, a first portion of the third interconnect layer located in the via of the second interconnect layer and located in the via of the first dielectric layer, the third interconnect layer electrically coupling the second interconnect layer and the first interconnect layer through the via of the first dielectric layer and through the via of the second interconnect layer wherein a lithographic width of the second interconnect layer and the third interconnect layer is substantially equal to the contact dimension.

13. The method of claim 12 wherein the plurality of semiconductor devices are bipolar transistors.

14. The method of claim 12 wherein the first dielectric layer is planarized by a chemical mechanical polishing (CMP) process.

15. The semiconductor component of claim 12 wherein the third interconnect layer comprises one of either tungsten or titanium.

16. The semiconductor component of claim 12 wherein the third interconnect layer a composite refractory metal layer containing a plurality of refractory metallic atoms.

17. The semiconductor component of claim 12 wherein the third interconnect layer functions as both an electrical interconnect material between the first and second interconnect layers and as an anti-reflective coating for lithographic operations.

18. The semiconductor component of claim 12 wherein the third interconnect layer functions as both an electrical interconnect material between the first and second interconnect layers and as an anti-reflective coating for lithographic operations.

19. The semiconductor component of claim 12 wherein the third interconnect layer has a bottom portion of titanium that is between 200–400 Angstroms in thickness and an upper portion of titanium nitride that is between 400–1000 Angstroms in thickness.

20. The semiconductor component of claim 12 wherein a dielectric sidewall spacer is formed within the via.

* * * * *